(12) United States Patent
Ng et al.

(10) Patent No.: US 11,990,394 B2
(45) Date of Patent: May 21, 2024

(54) SEMICONDUCTOR PACKAGE AND A METHOD FOR MANUFACTURING OF A SEMICONDUCTOR PACKAGE

(71) Applicant: NEXPERIA B.V., Nijmegen (NL)

(72) Inventors: Kim Ng, Nijmegen (NL); On Lok Chau, Nijmegen (NL); Wai Keung Ho, Nijmegen (NL); Raymond Wong, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 131 days.

(21) Appl. No.: 17/475,612

(22) Filed: Sep. 15, 2021

(65) Prior Publication Data

US 2022/0084919 A1  Mar. 17, 2022

(30) Foreign Application Priority Data

Sep. 16, 2020 (EP) ..................................... 20196426

(51) Int. Cl.
*H01L 23/495* (2006.01)
*H01L 21/48* (2006.01)
*H01L 23/31* (2006.01)
*H01L 23/532* (2006.01)

(52) U.S. Cl.
CPC .... *H01L 23/49582* (2013.01); *H01L 21/4821* (2013.01); *H01L 23/31* (2013.01); *H01L 23/53242* (2013.01)

(58) Field of Classification Search
CPC ........................... H01L 21/4821; H01L 23/31; H01L 23/53242

USPC ......................................................... 257/677
See application file for complete search history.

(56) References Cited

U.S. PATENT DOCUMENTS

| 9,653,385 | B1 | 5/2017 | Fang |
| 2016/0204003 | A1 | 7/2016 | Kwan et al. |
| 2019/0080930 | A1 | 3/2019 | Neoh et al. |
| 2019/0279942 | A1* | 9/2019 | Crema .............. H01L 23/49513 |

FOREIGN PATENT DOCUMENTS

JP   H05190726 A   7/1993

OTHER PUBLICATIONS

Extended European Search Report and Written Opinion for corresponding European application EP 20196426.9, 8 pages, dated Mar. 23, 2021.

* cited by examiner

*Primary Examiner* — Caleb E Henry
*Assistant Examiner* — Dilinh P Nguyen
(74) *Attorney, Agent, or Firm* — Ruggiero McAllister & McMahon LLC

(57) ABSTRACT

A semiconductor package including a lead frame, an Ag plated surface positioned on the lead frame, an adhesion promotion layer positioned on the top of the Ag plated surface, and mold body covering the top of the lead frame is provided. The Ag plated surface covers a significant part of an interconnection area of the lead frame surface, and the Ag plating surface does not exceed the area of the mold body.

19 Claims, 4 Drawing Sheets

SEMICONDUCTOR PACKAGE AND A METHOD FOR MANUFACTURING OF A SEMICONDUCTOR PACKAGE

CROSS REFERENCE TO RELATED APPLICATION

This application claims the benefit under 35 U.S.C. § 119(a) of European Application No. 20196426.9 filed Sep. 16, 2020, the contents of which are incorporated by reference herein in their entirety.

BACKGROUND OF THE DISCLOSURE

1. Field of the Disclosure

The present disclosure relates to a semiconductor package and a semiconductor device comprising the semiconductor package. The present disclosure also relates to a method of forming a semiconductor package.

2. Description of the Related Art

Known leaded packages for various semiconductor devices are using a lead frame as a carrier during the assembly process. Known lead frame base metals are alloy 42 (A42) or copper (Cu) alloy. It is also known in the art that on a top surface of the base metal, a silver (Ag) plating will be needed in order to enable a die bonding and a wire bonding processes. A disadvantage of such an Ag plating surface is a poor adhesion to mold compound. During operation or reliability test of a semiconductor device made in this way, the mold compound may separate from the Ag plated surface. Such a delamination may create an ingress path for external contaminants to enter into functional areas inside the package, and result in corrosion and failure of internal interconnection.

There are, in the art known, approaches aiming to solve the above mentioned poor adhesion issue.

In one of the known approaches, an alternate mold compound can be used to improve the overall package integrity. However, the Ag plated surface still remains the weakest point which is highly vulnerable for a delamination.

It is also known that the Ag plated area can be designed to a minimum area, which the minimum area is just enough for the die bonding and the wire bonding. However, this approach will reduce the lead frame flexibility for different die sizes. Moreover, in this case a tightened process window for die bonding and wire bonding is required. In certain cases, the Ag plated area cannot be reduced further to minimize the problem.

It is also known in the art that a surface roughening can be achieved by an etching method as one step in the lead frame manufacture process. In that case the objective is to create a stronger mechanical interlocking feature for a mold compound. However, there is a limitation to apply this approach due to the interconnect materials' compatibility. The base metal and the surface finish will need to be compatible with the bonding materials and methods, e.g. eutectic bonding. Such a roughening technology is generally applied to a pre-plated copper lead frame with a nickel plated surface. However, such a technology is not available for Ag plated surface.

Specifically for Ag plated surface, another known approach is to form an adhesion promotion layer on top of Ag plated surface. The layer, which is essentially Ag-oxide, will then provide a better adhesion to the mold compound. This surface oxidation can be achieved by appropriate chemistry in one step of the lead frame manufacture process. The oxidation chemical typically reacts to Ag surface, but not the Cu surface. To further increase the adhesion, beside the original Ag plated area designed for interconnection, it is known as the general practice is to add a thin Ag plated layer, e.g. Ag strike plating, over the entire lead frame surface. This will then enable an Ag adhesion promotion layer formed all over the lead frame surface. The presence of the adhesion promotion layer typically does not affect the interconnection process during package assembly. However, the presence of the Ag plating and the adhesion promotion layer on lead terminals will lead to two side effects. Firstly, after molding, the leaded packages will go for tin plating to provide solderable lead terminals for customer board mounting. Additional Ag strip process will be needed to add to assembly in-house plating so to remove the Ag plating before the tin plating is possible. Secondly, during molding process, there is always mold flash running onto the lead terminal surface. With the Ag adhesion promotion layer also on the lead terminal surface, the mold flash is difficult to be removed by a standard deflash process and may cause a package appearance issue or a potential solderability issue during the board mounting.

A known method of Ag plating and providing an adhesion promotion layer that can be applied on one side or both sides of lead frame is disclosed in the patent application US20190080930A1.

This patent application discloses a method of producing a lead-frame structure having two faces and exposing a treated silver surface on at least one of the two faces. The treated silver surface serves for the wire bonding, which yields a surface which, after applying resin to it, has an adhesion even under severe testing conditions. The patent application also discloses a method of producing a surface mount electronic device including a lead-frame or lead-frame entity and at least one semiconductor device mounted thereon, wherein the lead-frame or lead-frame entity exposes a treated silver surface on at least one of the two faces. The treated silver surface serves the wire bonding. A resin is applied to the lead-frame or lead-frame entity. The method provides an adhesion of the surface of the lead-frame or lead-frame entity even under severe testing conditions.

A known semiconductor device is disclosed in the patent application US20190279942A1. The Ag plating and adhesion promotion layer are applied on one side or both sides of lead frame. The lead frame surface finish is applied full Ag plating, then the adhesion promotion layer is added after die bonding.

The patent application discloses a lead frame design that includes a copper alloy base material coated with an electroplated copper layer, a precious metal, and an adhesion promotion compound. The layers compensate for scratches or surface irregularities in the base material while promoting adhesion from the lead frame to the conductive connectors, and to the encapsulant by coupling them to different layers of a multilayer coating on the lead frame. The first layer of the multilayer coating is a soft electroplated copper to smooth the surface of the base material. The second layer of the multilayer coating is a thin precious metal to facilitate a mechanical coupling between leads of the lead frame and conductive connectors. The third layer of the multilayer coating is the adhesion promotion compound for facilitating a mechanical coupling to an encapsulant around the lead frame.

SUMMARY

Various example embodiments are directed to the disadvantage as described above and/or others which may become apparent from the following disclosure.

According to an embodiment of this disclosure a semiconductor package comprises a lead frame, an Ag plated surface positioned on the lead frame, an adhesion promotion layer positioned on the top of the Ag plated surface, and mold body covering the top of the lead frame. The Ag plated surface covers a significant part of an interconnection area of the lead frame surface. The Ag plating surface does not exceed the area of the mold body.

According to an embodiment of the disclosure, the Ag plating area for an interconnection area is expanded beyond an usual, i.e. known, design rule to cover more lead frame surface within the mold body which now defines the maximum Ag plated area for the adhesion promotion layer. After molding process, the molded lead frame will appear the same as standard molded lead frame. There will be no change to the entire assembly process, and also no visible change to the further customers of such a semiconductor package. Lead frame suppliers can simply process the lead frame with a specified new area of Ag plating on the lead frame and add the adhesion promotion layer. Such lead frame does not require different processing in assembly, i.e. no extra complexity is introduced, while an advantageous semiconductor package is created.

The advantage of such a semiconductor package is that the package integrity is significantly improved, and a chance of any potential delamination is reduced.

Moreover, this layer is kept within the semiconductor package such that the external lead terminals are free from the mold flash so to ensure good solderability during a later board mounting.

According to an embodiment of the disclosure, the Ag plated surface covers the whole interconnection part of the lead frame surface.

According to an embodiment of the disclosure, the Ag plated surface has an uniform thickness. This uniform thickness is preferably in a range between 2.5 µm to 5.5 µm.

According to an embodiment of the disclosure, the adhesion promotion layer is an Ag oxide. The adhesion promotion layer has preferably a thickness in a range between 1 nm to 5 nm.

The disclosure also relates to a semiconductor device compromising a semiconductor package as described in the embodiments above.

The disclosure also relates to a method of producing a semiconductor package as described in the embodiments above.

According to an embodiment of the disclosure, a method of producing a semiconductor package compromises the steps:
  providing a raw material for a lead frame,
  creating the structure of the lead frame by stamping and/or etching,
  creating an Ag plating surface on a significant part of an interconnection area or the whole area of the interconnection area of the lead frame, and
  creating an adhesion promotion layer on the Ag plating surface.

According to an embodiment of the disclosure, the above described method of producing a semiconductor further comprises other usual steps for producing of the semiconductor package.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

According to an embodiment of the disclosure, a leaded semiconductor package comprises a lead frame structure with a silver (Ag) adhesion promotion layer. This Ag adhesion promotion layer is applied to a designated area on a top surface of the lead frame area inside the semiconductor package. The Ag adhesion promotion layer in this way improves the adhesion of a mold compound to the lead frame, thereby increasing package integrity since it is reducing any potential delamination in the semiconductor package. The Ag adhesion promotion layer is kept within the semiconductor package so that external lead terminals are free from a mold flash. In this way an excellent solderability during a board mounting is ensured.

According to an embodiment of this disclosure an Ag plating area for interconnection is expanded beyond usual design rule, so to cover more of a lead frame surface within a mold body. This defines a maximum Ag plated area for adhesion for a promotion layer. After molding process, a molded lead frame produced in this way will appear the same as a standard molded lead frame. Moreover, there will be no change, i.e. no extra complexity, to the entire assembly process, and also no visible change to customers.

In this way lead frame suppliers can simply process such a lead frame with a specified new area of Ag plating on the lead frame, and add an adhesion promotion layer. Such a lead frame does not require any different processing in assembly. Thus, the full advantage is achieved without any increase of complexity in the assembly.

Figure 1:
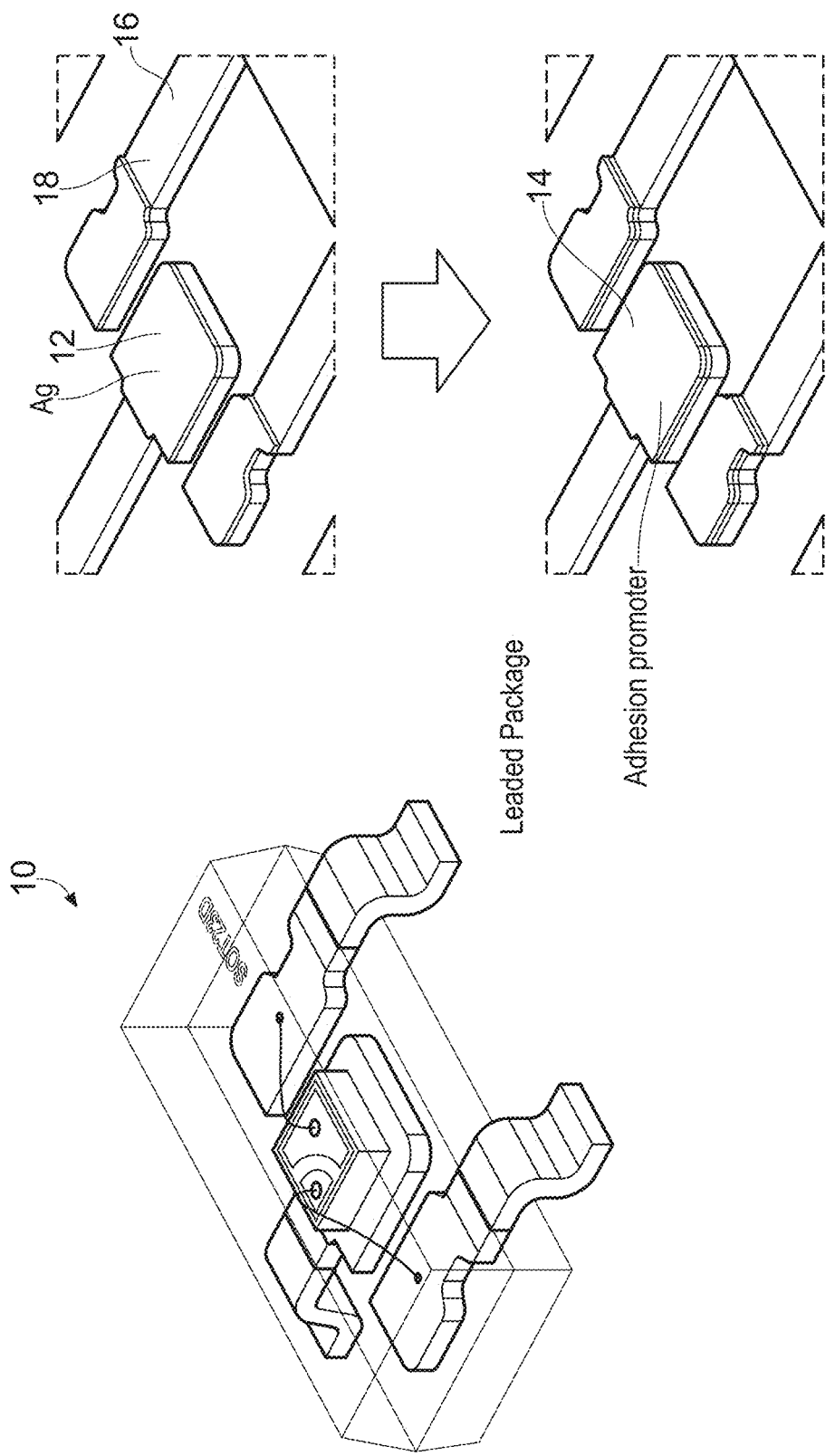
FIG. 1 shows a semiconductor package according to an embodiment of the disclosure.

An embodiment of the disclosure is shown in FIG. 1. A leaded package 10 comprises a lead frame 16 with an Ag plating area 12. This Ag plating area 12 is maximized to cover a top surface 18 of the lead frame 16 within the bound of a mold body. It is supporting a package interconnection, for example a die bonding, or a wire bonding. Its area is significantly expanded from an usual design rule.

An Ag surface plating is of an uniform thickness, preferably in a range between 2.5 µm to 5.5 µm, as it may be required by usual lead frame manufacture by capable suppliers. On the top of the Ag plating area 12 an adhesion promotion layer 14 is provided. This adhesion promotion layer 14 ensures an improved adhesion to a mold compound.

Other lead frame surface is free of an Ag plating or an Ag strike plating, so to enable the lead frame to be processed in regular assembly flow without any increase of complexity of this assembly process.

Figure 2:
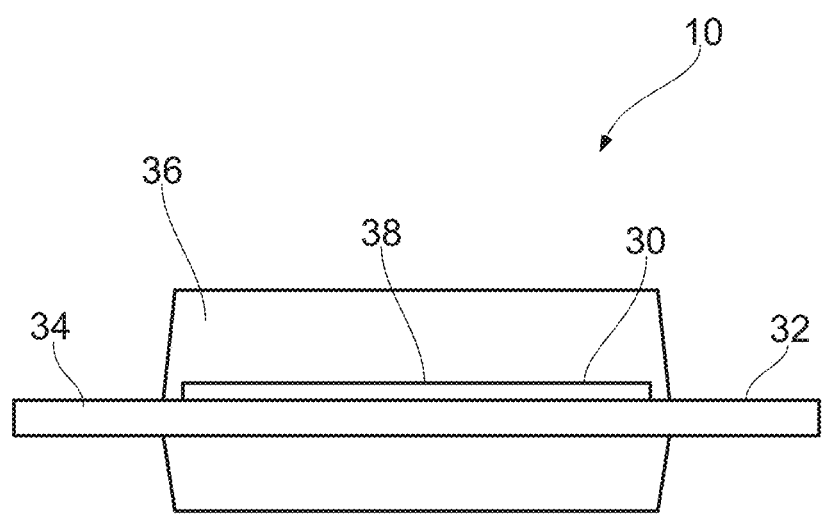
FIG. 2 shows a semiconductor package according to an embodiment of the disclosure.

A leaded package, according to an embodiment of the disclosure, is shown in FIG. 2. The leaded package 10 comprises a lead frame 34 and a mold compound 36. The leaded package further comprises an Ag plated surface 38 and an adhesion promotion layer. The Ag plated surface is applied to one side of the lead frame 34, with the maximum area defined by the mold compound 36. That enables the key feature of the disclosure, the adhesion promotion layer is confined to a first area 30 on the lead frame 34 within the mold compound 36, and it is not present in the second area 32 on the lead frame 34. Furthermore, the Ag plated surface 38 has an uniform thickness.

Thus, according to this embodiment of the disclosure, the Ag plated surface can be maximized so to enhance the mold compound adhesion performance without introducing any additional Ag strip process or mold flash adhesion side effect.

The Ag adhesion promoter layer is preferably about 1-5 nm thick Ag oxide. The Ag plated surface is uniform in thickness, and it is preferably typically in the range from 2.5 µm to 5.5 µm.

In a preferred embodiment of the disclosure, the Ag plated surface is relatively large, i.e. larger than an area for die bonding and wire bonding. Nevertheless, the maximum size of the area of the Ag plated surface is still kept within the boundary of the molded area. The rest of the lead frame surface, i.e. bottom side, lead terminals, are free from Ag plating or Ag strike plating.

Figure 3:
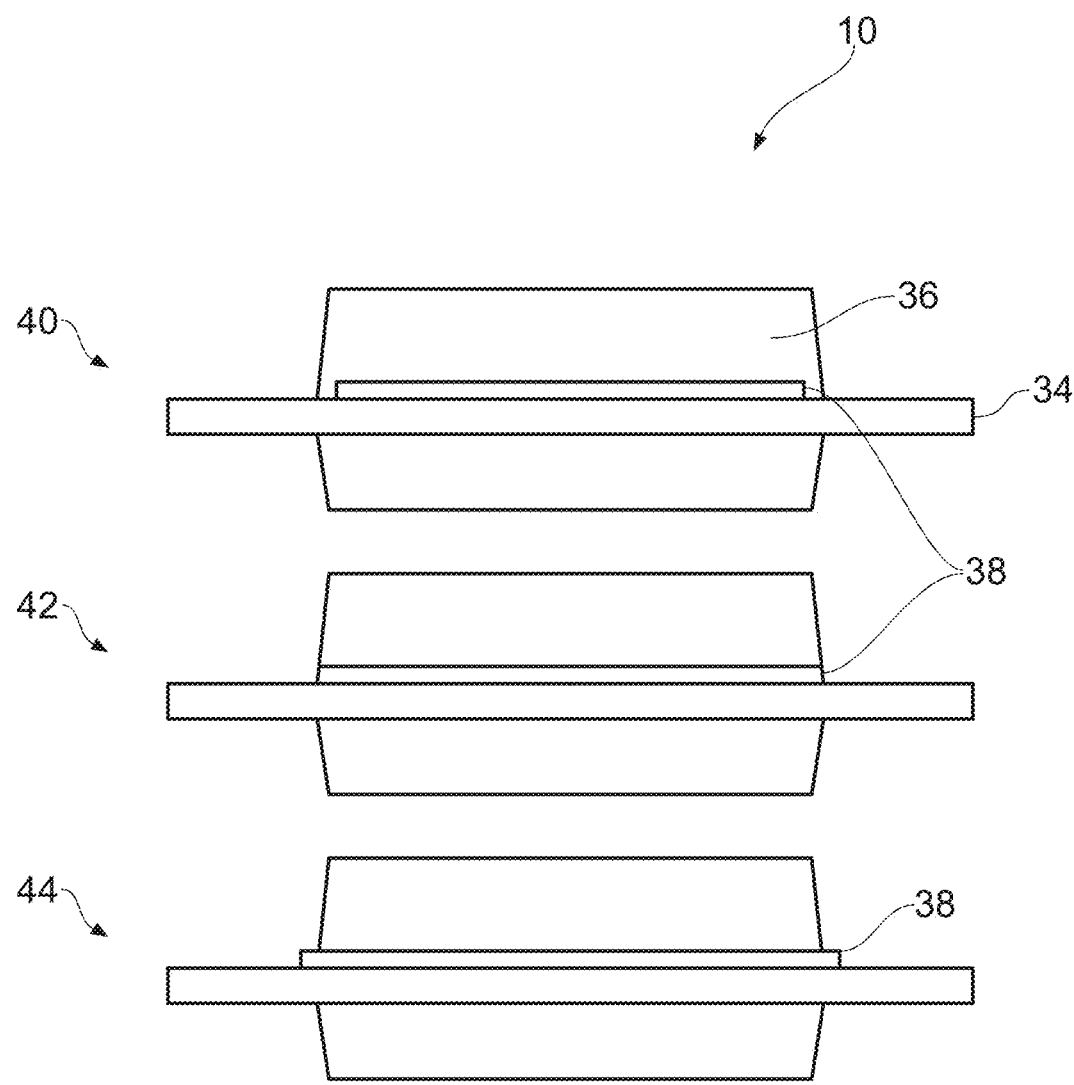
FIG. 3 shows a semiconductor package according to an embodiment of the disclosure.

An embodiment of the disclosure is shown in FIG. 3. The lead frame Ag plated surface/area design can be adjusted slightly to fit for the package application and to optimize the package delamination performance. As shown in three exemplary embodiments 40, 42 and 44, the Ag plated surface 38 can be slightly smaller (reference 40), about the same size (reference 42), or slightly larger (reference 44) compared to the mold compound 36.

The disclosure is also applicable for different types of semiconductor packages, e.g. quad flat packages (QFP), dual in-line packages (DIP), or any other suitable semiconductor packages where AG plated surfaces can be used. Great advantage of this disclosure is that the most of the conventional lead frame design rules remain unchanged, i.e. there is no increase in the respective manufacturing complexity, while a new lead frame can be created with maximized Ag plated area inside the package body. Then the Ag adhesion layer is applied to the Ag plated area for improved mold compound adhesion.

Different plating chemistries can be applied for the creation of an Ag adhesion layer.

Figure 4:
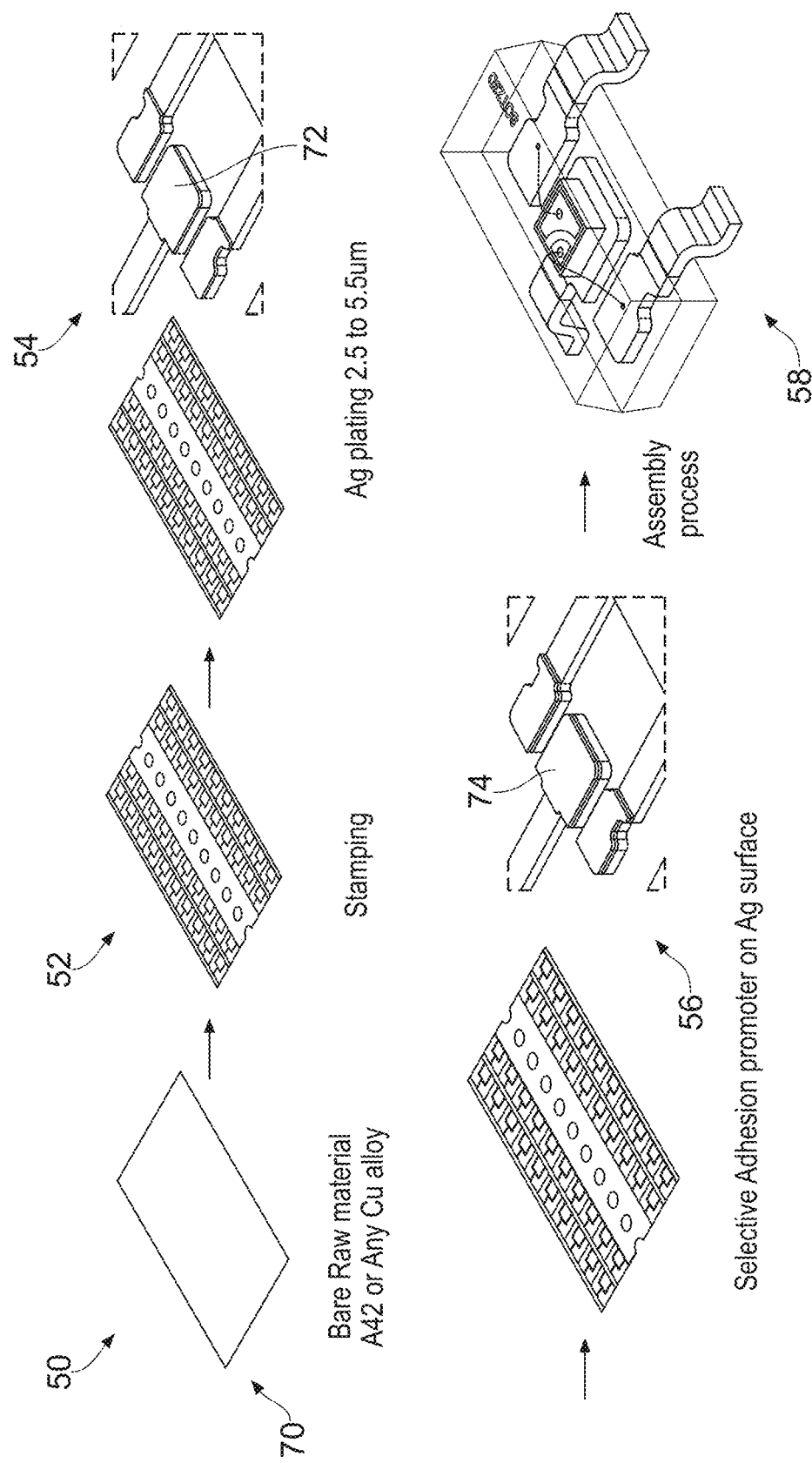
FIG. 4 shows steps of a method for creating a semiconductor package according to an embodiment of the disclosure.

According to an embodiment of the disclosure, steps of a method for creating a leaded semiconductor package are shown in FIG. 4.

In the step with the reference number 50 in FIG. 4, a raw material for a lead frame 70 is provided. The lead frame 70 can be made of regular base materials, for example Alloy42, copper (Cu) alloy, etc. Alloy42 comprises about 42% Nickel (Ni) and iron (Fe) for the rest of a composition. Cu alloy comprises mainly Cu and different adder with less than 5% of a composition.

In the step with the reference number 52 in FIG. 4, a lead frame structure of the lead frame 70 is formed by typical stamping and etching process.

In the step with the reference number 54 in FIG. 4, an Ag plated surface 72 is then added for an interconnection area of the lead frame 70. According to an embodiment of this disclosure the Ag plating surface 72 is expanded significantly from a normal design rule for the interconnection area.

Preferably the Ag plating surface 72 covers most of the lead frame surface within the bound of mold body. Preferably the Ag plating surface 72 does not exceed outside of the mold body area.

In the step with the reference number 56 in FIG. 4, an adhesion promotion layer 74 is then created on the top surface of the Ag plating surface 72.

In the step with the reference number 58 in FIG. 4, the lead frame 70 as prepared in the previous steps is processed in assembly with the usual production flow. That is actually the excellent advantage of this disclosure that no change, no extra complexity is required compared to the usual production flow.

A semiconductor package created according to the steps of this embodiment of the disclosure has an improved package integrity and therefore a long-term reliability is ensured.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure.

The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor package comprising:
a lead frame having a lead frame surface;
an Ag plated surface positioned on the lead frame;
an adhesion promotion layer positioned on a top of the Ag plated surface; and
a mold body covering a top of the lead frame;
wherein the Ag plated surface covers a significant part of an interconnection area of the lead frame surface, and wherein the Ag plated surface does not substantially exceed an area of the mold body so that a portion of the lead frame surface extending beyond the area of the mold body is free from Ag plating.

2. The semiconductor package as claimed in claim 1, wherein the Ag plated surface covers a whole of the interconnection area of the lead frame surface.

3. The semiconductor package as claimed in claim 2, wherein the Ag plated surface has an uniform thickness in a range between 2.5 μm to 5.5 μm.

4. The semiconductor package as claimed claim 2, wherein the adhesion promotion layer is an Ag oxide.

5. The semiconductor package as claimed in claim 2, wherein the adhesion promotion layer has a thickness in a range between 1 nm to 5 nm.

6. The semiconductor package as claimed in claim 1, wherein the Ag plated surface has a uniform thickness in a range between 2.5 μm to 5.5 μm.

7. The semiconductor package as claimed in claim 6, wherein the adhesion promotion layer has a thickness in a range between 1 nm to 5 nm.

8. The semiconductor package as claimed claim 6, wherein the adhesion promotion layer is an Ag oxide.

9. The semiconductor package as claimed claim 1, wherein the adhesion promotion layer is an Ag oxide.

10. The semiconductor package as claimed in claim 9, wherein the adhesion promotion layer has a thickness in a range between 1 nm to 5 nm.

11. The semiconductor package as claimed in claim 1, wherein the adhesion promotion layer has a thickness in a range between 1 nm to 5 nm.

12. A semiconductor device compromising the semiconductor package as claimed in claim 1.

13. A method of producing a semiconductor package as claimed in claim 1.

14. The semiconductor package of claim 1, wherein the adhesion promotion layer does not exceed an area of the mold body so that a portion of the lead frame surface extending beyond the area of the mold body does not have the adhesion promotion layer.

15. The semiconductor package of claim 1, wherein the Ag plated surface is either slightly smaller than the mold body, about the same size as the mold body, or slightly larger than the mold body.

16. A method of producing a semiconductor package, the method compromising the steps of:
providing a raw material for a lead frame;
creating a structure of the lead frame by stamping and/or etching;
creating an Ag plating surface on a significant part of an interconnection area of the lead frame; and
creating an adhesion promotion layer on the Ag plating surface; and wherein the Ag plating surface does not cover a portion of a lead frame surface that is designed not to extend beyond an area of a mold body for the semiconductor package.

17. The method of producing a semiconductor package as claimed in claim 16, wherein the Ag plating surface covers a whole of the interconnection area of the lead frame.

18. The method of producing a semiconductor package as claimed in claim 16, further comprising other usual steps for production of the semiconductor package are performed.

19. The method of producing a semiconductor package as claimed in claim 16, wherein the adhesion promotion is designed not to exceed the area of the mold body of the semiconductor body.

* * * * *